United States Patent [19]

Gaboriaud

[11] 4,264,837

[45] Apr. 28, 1981

[54] ULTRASONIC ATOMIZER WITH AUTOMATIC CONTROL CIRCUIT

[76] Inventor: Paul Gaboriaud, 1, rue Branly, 92130 Issy les Moulineaux, France

[21] Appl. No.: 25,591

[22] Filed: Mar. 30, 1979

[30] Foreign Application Priority Data

Mar. 31, 1978 [FR] France ................................ 78 09428

[51] Int. Cl.[3] ............................................ H01L 41/08

[52] U.S. Cl. .................................... 310/316; 239/102

[58] Field of Search ............... 310/314, 316, 317, 318, 310/323, 325, 321; 239/102; 128/194

[56] References Cited

U.S. PATENT DOCUMENTS

| | | | |
|---|---|---|---|
| 3,214,101 | 10/1965 | Perron | 310/325 X |
| 3,432,691 | 3/1969 | Shoh | 310/316 |
| 3,489,930 | 1/1970 | Shoh | 310/316 |
| 3,668,486 | 6/1972 | Silver | 310/316 X |
| 3,819,961 | 6/1974 | Bourgeois et al. | 310/316 |
| 3,842,340 | 10/1974 | Brandquist | 310/316 X |
| 3,904,896 | 9/1975 | Guntersdorfer | 310/323 X |
| 3,967,143 | 6/1976 | Watanabe et al. | 310/316 |
| 3,975,650 | 8/1976 | Payne | 310/316 |
| 4,081,706 | 3/1978 | Edelson | 310/316 |
| 4,168,447 | 9/1979 | Bussiere | 310/323 X |

OTHER PUBLICATIONS

Ultrasonic Atomizer Incorporating a Self-actuating Liquid Supply, by E. P. Lierke, *Ultrasonics*, Oct. 1967, pp. 214–218.

*Primary Examiner*—Mark O. Budd

*Attorney, Agent, or Firm*—Steinberg & Raskin

[57] ABSTRACT

A method and a device for energizing piezo-electric ultra-sound transducers, wherein rectangular pulses of calibrated duration generate in an oscillation circuit of the transducer damped waves with a frequency equal to the natural frequency of the transducer and modulated at the recurrence frequency of the rectangular pulses.

4 Claims, 3 Drawing Figures

ULTRASONIC ATOMIZER WITH AUTOMATIC CONTROL CIRCUIT

The present invention belongs to the field of atomization (conversion into aerosols) of liquids through ultrasonic vibrations with a view to mainly provide humidifiers (water aerosols) and fuel oil-fired burners (fuel aerosols). The general principle of the atomizer or like sprayer device has been known for a long time; a bar or rod (transducer) focussing with a high acoustic strength (generally a piezo-electric crystal triplet) vibrating in resonance with an ultrasonic frequency of about 50 kHz to 100 kHz, is bored or pierced through along its axis to form one (or several) medullary ducts or like passageways through which a liquid is flowing every drop of which as soon as it arrives at the focussed radiating face. The vibrating bar or rod is energized by an electronic generator of high-frequency (in short, HF) electric current, the frequency of which is controlled by the natural acoustic resonant frequency of the bar or rod which is itself variable at any time according to the temperature, the pressure, the flow rate, the length of the flame and other factors. Such atomizers generally suffer from starting difficulties. Only a particular structure of the transistorized electronic generator forming the subject matter of the instant invention generating high-amplitude, steep-edge, percussion-like signals has made it possible to fully overcome such difficulties. The object of the present invention is to provide a new design of a transistorized electronic generator generating percussion-shaped signals consisting of rectangular or square pulses with a defined pulse duration or width and with a resonant frequency which is a sub-multiple of the natural acoustic resonant frequency of the vibrating rod; such a recurrence or repetition rate being automatically controlled by the natural frequency of the rod through an auxiliary synchronizing circuit for sychronization through a frequency divider.

The invention will be better understood and further objects, characterizing features, details and advantages thereof will appear more clearly as the following explanatory description proceeds with reference to the accompanying diagrammatic drawings given by way of non-limiting examples only illustrating several specific presently preferred embodiments of the invention and wherein.

Figure 1:
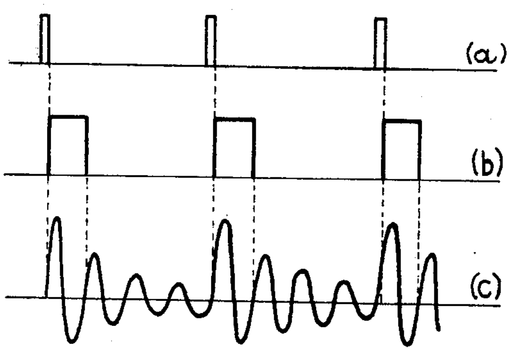
FIG. 1 is a chart in which are plotted 3 curves overlying in phase correspondence to show the signals at various points of the electronic generator.

In FIG. 1 the curve (a) shows the pilot or master timing clock pulses with a frequency N which is a sub-multiple of the resonant frequency F of the rod. The curve (b) shows the rectangular pulses of measured duration obtained through conversion of the clock pulses. The curve (c) shows the high-frequency or HF-current in the emitter crystal which current has the shape of damped waves having a frequency F (called pseudo-frequency) and with an amplitude modulation having a frequency N.

Figure 2:
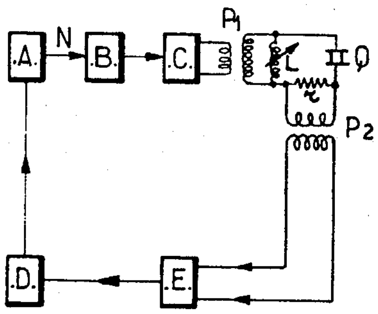
FIG. 2 is block diagram illustrating by way of a non-limiting exemplary embodiment the construction of the generator.

In FIG. 2, the block A designates the pilot or clock which functions as a square wave pulse generator to produce rectangular pulses, for instance a multivibrator or a unijunction transistor supplying pulses with a frequency N; the block B converts such pulses into rectangular pulses of defined duration or width, and may for instance consist of a monostable multivibrator or in a more simple manner of a transistor arranged as a "pulse-stretcher". The block C forming a power stage with a class B transistor amplifies the rectangular pulses and conveys them through the transformer $P_1$ to the emitter crystal Q. The secondary winding of the transformer $P_1$ forms together with the capacity of the crystal Q and with the addition of the adjustable reactance coil L, a circuit resonating at the frequency F of the bar or rod.

An auxiliary synchronizing circuit comprises, connected in series with the crystal Q, a resistor r the voltage of which is fed by the transformer $P_2$ to a block E comprising a phase-correcting circuit and a peak limiter or clipper (for instance a Schmitt trigger circuit). The derivative pulses of the block E are applied to a frequency divider D, the output pulses of which are fed to the synchronizing circuit of the pilot A. In order to provide an order of magnitude, it is assumed that the recurrence or repetition rate N of the clock pulses is 5 kHz and the frequency F of the rod is 50 kHz. The frequency divider D will divide by 10.

Figure 3:
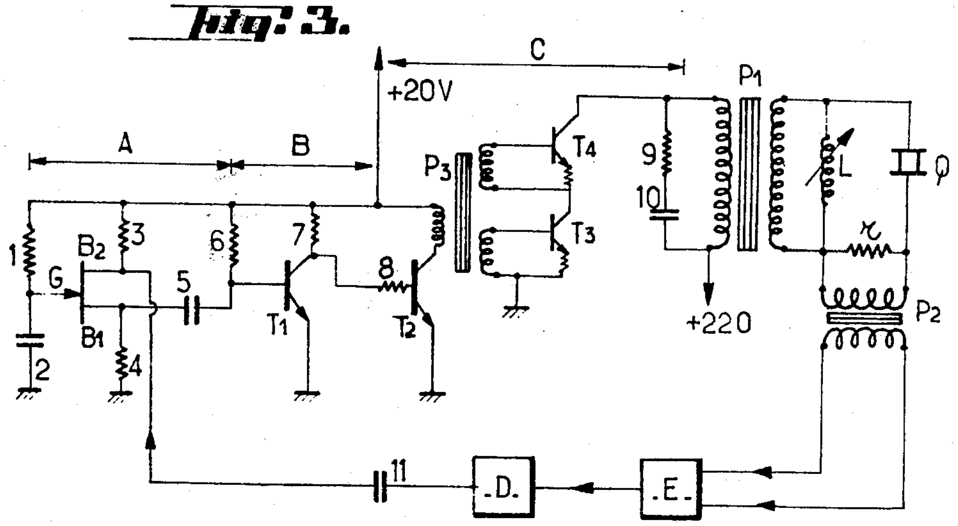
FIG. 3 shows an exemplary embodiment of a practical circuit diagram.

FIG. 3 is an exemplary embodiment of a practical diagram of the recommended electronic circuits. The clock is a unijunction transistor wherein G designates the emitter and $B_1$, $B_2$ both bases thereof. The base $B_2$ is connected to +20 volts through the resistor 3 and the base $B_1$ is grounded through the resistor 4. The resistance-capacitance circuit or RC network consists of the resistor 1 and the capacitor 2 and determines the repetition frequency or recurrence rate N. The positive pulses are taken from the base $B_1$ and fed to the transistor $T_1$ through the capacitor 5, resistor 6 connection, the product of the values RC of which defines the calibrated or set duration of the rectangular pulses (b) of FIG. 1.

The transistor $T_1$, which is saturated in its rest condition, operates as a pulse-stretcher and generates rectangular pulses at its collector resistor 7. The signals are applied through a series resistor 8 to the base of the transistor $T_2$ or stage driver, the collector of which feeds the primary winding of the connecting transformer $P_3$. The transformer $P_3$ has two separate secondary windings energizing the base-emitter circuits of both class B power transistors $T_3$, $T_4$ connected in series. The series connection of both (or more if desired) transistors $T_3$ and $T_4$ would enable them to be fed from rectified supply mains without any power or distribution transformer thereby substantially reducing the size and the price of the apparatus. The primary winding of the output transformer $P_1$ is connected to the collector of the transistor $T_4$ and shunted by a resistance-capacitance network (9–10) with a view to reduce the break-included voltage surges. The secondary winding of the transformer $P_1$ forms together with the capacity of the crystal Q and the adjustable reactance of the choke coil L connected in parallel a circuit resonating at the frequency F of the crystal. The other elements r, $P_2$, E, D are the same as those of FIG. 2.

The negative pulses originating from the frequency divider D are fed through the connecting capacitor 11 to the base $B_2$ with a view to provide for the synchronization of the clock. Alternatively, the rectangular pulses (b) of calibrated duration may be obtained by a multivibrator but the synchronization is more difficult.

The main applications of the present invention are the humidifier (water aerosol) and the fuel oil fired-burner (fuel aerosol).

What is claimed is:

1. A method of energizing an ultrasonic atomizer for converting liquids to aerosols, said atomizer including a piezoelectric ultrasonic transducer having at least one passageway adapted for the passage of a liquid to be converted into an aerosol, said method comprising the step of exciting the ultrasonic transducer to vibrate at its resonant frequency by applying thereto percussion-like pulses of high energy having a recurrence frequency which is a sub-multiple of said resonant frequency.

2. An ultrasonic atomizer for converting liquids to an aerosol, said atomizer having an electrical oscillating circuit and a piezoelectric ultrasonic transducer having at least one passageway for the passage of a liquid to be atomized, said transducer being connected in said oscillating circuit and adapted to vibrate at its ultrasonic resonant frequency, said atomizer comprising a square wave pulse generator coupled to said oscillating circuit for producing high amplitude, percussion-like rectangular pulses of calibrated duration having a recurrence frequency which is a sub-multiple of the resonant frequency of said transducer thereby producing a vibration of said transducer which is amplitude modulated by said percussion-like pulses; and a feedback circuit coupled between said oscillating circuit and said pulse generator, said feedback circuit including a frequency divider having a frequency dividing ratio corresponding to the ratio of the frequency of said pulses and the frequency of said oscillating circuit.

3. An ultrasonic atomizer as claimed in claim 2, wherein said pulse generator comprises a unijunction transistor producing output pulses, and further comprising a pulse-stretcher type transistor producing output signals, the output pulses of said unijunction transistor being applied to said pulse-stretcher type transistor, a connecting transformer having a primary winding coupled to said pulse-stretcher type transistor and receiving the output signals thereof and separate secondary windings, and power transistors each having a base-emitter circuit connected to a corresponding one of said secondary windings, said power transistors being connected in series and coupled to said feedback circuit.

4. An ultrasonic atomizer as claimed in claim 2, wherein said pulse generator comprises a multivibrator generating rectangular pulses of calibrated duration and desired frequency.

* * * * *